US 011843371 B2

United States Patent
Yanagihashi

(10) Patent No.: US 11,843,371 B2
(45) Date of Patent: Dec. 12, 2023

(54) SEMICONDUCTOR DEVICE

(71) Applicant: RENESAS ELECTRONICS CORPORATION, Tokyo (JP)

(72) Inventor: Fumiaki Yanagihashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/560,690

(22) Filed: Dec. 23, 2021

(65) Prior Publication Data
US 2022/0247405 A1  Aug. 4, 2022

(30) Foreign Application Priority Data

Jan. 29, 2021  (JP) .................... 2021-013055

(51) Int. Cl.
*H03K 17/687* (2006.01)
*H03F 3/45* (2006.01)

(52) U.S. Cl.
CPC ..... *H03K 17/6872* (2013.01); *H03F 3/45475* (2013.01)

(58) Field of Classification Search
CPC .............. H03K 17/6872; H03F 3/45475
See application file for complete search history.

(56) References Cited

U.S. PATENT DOCUMENTS 5,635,860 A    6/1997  Westerwick
5,844,425 A   12/1998  Nguyen et al.
6,054,876 A *  4/2000  Horie ............... H03F 3/45183
                                                    327/437
6,118,301 A *  9/2000  Singh ................ G06F 13/4072
                                                     326/86

(Continued)

FOREIGN PATENT DOCUMENTS

CN    107608440 A  *  1/2018
CN    108512534 A  *  9/2018  ............ B60R 16/03

(Continued)

OTHER PUBLICATIONS

Extended European Search Report issued in corresponding European Patent Application No. 22153085.0-1020, dated Jun. 22, 2022.

*Primary Examiner* — Sibin Chen
*Assistant Examiner* — James G Yeaman
(74) *Attorney, Agent, or Firm* — Rimon P.C.; Tomoki Tanida

(57) ABSTRACT

A semiconductor device of the present invention includes: a P-type output transistor configured to have a source to which a power supply voltage is applied, and a drain connected to an external connection pad; a gate wiring configured to be connected to a gate of the output transistor; a signal transmitting portion configured to transmit an input signal to the gate wiring; and a voltage-breakdown protecting portion configured to apply the power supply voltage to a back gate of the output transistor if a voltage on the external connection pad is equal to or lower than the power supply voltage, or the voltage-breakdown protecting portion bringing the signal transmitting portion into a disconnection state and applies the voltage on the external connection pad to the gate and the back gate of the output transistor if the voltage applied on the external connection pad is higher than the power supply voltage.

6 Claims, 11 Drawing Sheets

(56) References Cited

U.S. PATENT DOCUMENTS

| | | | | |
|---|---|---|---|---|
| 6,236,194 | B1* | 5/2001 | Manabe | G05F 1/565 |
| | | | | 323/284 |
| 6,265,926 | B1* | 7/2001 | Wong | H03K 19/00315 |
| | | | | 327/309 |
| 6,580,411 | B1* | 6/2003 | Kubota | G09G 3/3688 |
| | | | | 377/64 |
| 6,801,417 | B2* | 10/2004 | Arai | H03K 19/00315 |
| | | | | 361/56 |
| 7,362,145 | B2* | 4/2008 | Takemura | H03K 19/0013 |
| | | | | 326/82 |
| 8,395,870 | B2* | 3/2013 | Maede | H03K 19/0185 |
| | | | | 326/82 |
| 8,816,722 | B2* | 8/2014 | Nishijima | G01R 19/0092 |
| | | | | 327/72 |
| 2003/0117174 | A1* | 6/2003 | Patel | H03K 19/018585 |
| | | | | 326/86 |
| 2014/0085119 | A1* | 3/2014 | Masuda | H03M 1/06 |
| | | | | 341/122 |

FOREIGN PATENT DOCUMENTS

| | | | | |
|---|---|---|---|---|
| CN | 104965555 | B | * 11/2018 | |
| CN | 211406369 | U | * 9/2020 | |
| JP | 2000209042 | A | * 7/2000 | |
| JP | 2008277449 | A | * 11/2008 | |
| JP | 2009252259 | A | * 10/2009 | |
| JP | 2019-213122 | A | 12/2019 | |
| KR | 20120121586 | A | * 4/2011 | |
| TW | 202013737 | A | * 4/2020 | H01L 23/481 |

\* cited by examiner

OPERATION IN OCCURRENCE OF CHANGE OF "PGn = 0V → VDD"

OPERATION IN OCCURRENCE OF CHANGE OF "VDD = 0V → VDD (Vpad = UNFIXED)"

OPERATION IN APPLICATION OF VOLTAGE OF "VDD < Vpad"

US 11,843,371 B2

SEMICONDUCTOR DEVICE

CROSS-REFERENCE TO RELATED APPLICATION

The disclosure of Japanese Patent Application No. 2021-013055 filed on Jan. 29, 2021, including the specification, drawings and abstract is incorporated herein by reference in its entirety.

BACKGROUND

The present invention relates to a semiconductor device, and relates to, for example, a semiconductor device including a driver circuit used for signal output.

There are disclosed techniques listed below.

[Patent Document 1] Japanese Unexamined Patent Application Publication No. 2019-213122

An output-stage circuit of the semiconductor device needs to be designed in accordance with an output impedance specification and designed to prevent electrostatic discharge (ESD) damage. In order to satisfy such design specification, it is necessary to use a large size transistor for the output-stage circuit. Accordingly, the Patent Document 1 discloses a technique related to this output-stage circuit.

A semiconductor device described in the Patent Document 1 is a semiconductor device connected to a first power supply voltage and a second power supply voltage that is lower than the first power supply voltage, and includes a driver circuit configured to receive an output signal as its input from a circuit operating in response to supply of the second power supply voltage and configured to output a signal having a shifted voltage level, and includes an output circuit configured to receive an output signal as its input from the driver circuit. The output circuit includes a first transistor between the first power supply voltage and an output node and a second transistor between the output node and a ground voltage. The driver circuit includes a middle-voltage generating circuit configured to receive the output signal as its input and convert the output signal to have a voltage level of a middle voltage and a signal generating circuit configured to output a driving signal for use in driving the first transistor in accordance with the middle voltage generated by the middle-voltage generating circuit.

SUMMARY

However, the output-stage circuit described in the Patent Document 1 has a problem of a large chip size since each size of a plurality of transistors configuring the output-stage circuit is large in order to satisfy the breakdown voltage specification.

Other objects and novel characteristics will be apparent from the description of the present specification and the accompanying drawings.

According to an embodiment, a semiconductor device includes: a P-type output transistor configured to have a source to which a power supply voltage is applied and a drain connected to an external connection pad; a gate wiring configured to be connected to a gate of the output transistor; a signal transmitting portion configured to transmit an input signal to the gate wiring; and a voltage-breakdown protecting portion configured to apply the power supply voltage to a back gate of the output transistor if the voltage applied on the external connection pad is equal to or lower than the power supply voltage or configured to bring the signal transmitting portion into a disconnection state and apply the voltage applied on the external connection pad to the gate and the back gate of the output transistor if the voltage applied on the external connection pad is higher than the power supply voltage.

According to the embodiment, in the semiconductor device, the breakdown voltage specification of the transistor can be satisfied along with the suppression of the chip area.

BRIEF DESCRIPTIONS OF THE DRAWINGS

DETAILED DESCRIPTION

In order to make the explanation clear, the following description and drawings are appropriately omitted or simplified. In each of the drawings, the same components are denoted with the same reference symbols, and the repetitive description thereof will be omitted if needed.

First Embodiment

Figure 1:
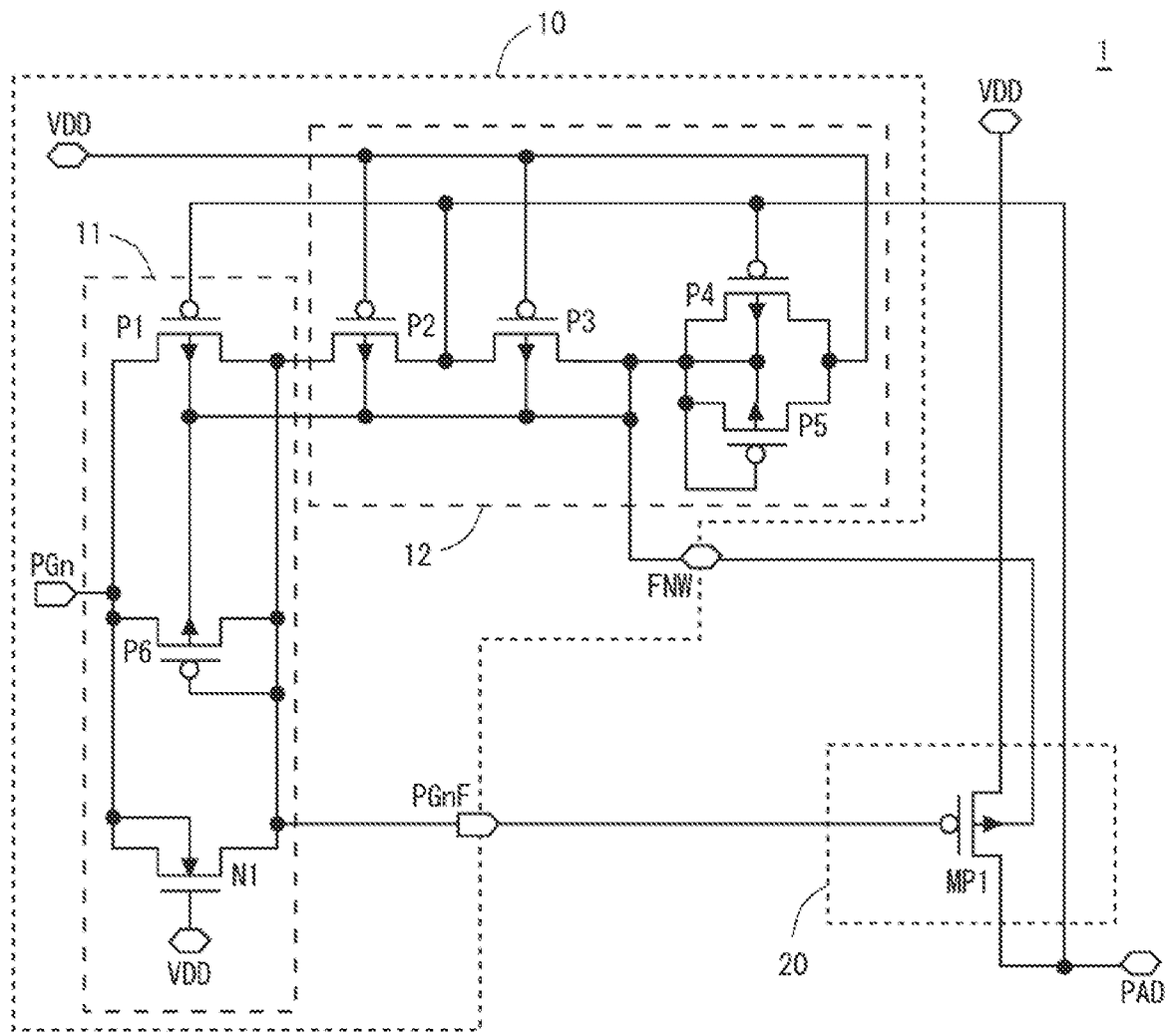
FIG. 1 is a circuit diagram of a semiconductor device according to a first embodiment.

One of features of a semiconductor device 1 according to the first embodiment is the output-stage circuit including the transistor connected to the external connection pad and a pre-stage circuit, and therefore, the output-stage circuit and the pre-stage circuit of the semiconductor device 1 will be explained below. FIG. 1 shows a circuit diagram of the semiconductor device 1 according to the first embodiment. In FIG. 1, a power supply wiring to which a power supply voltage VDD is applied is denoted with a reference symbol "VDD". The wiring inside the semiconductor device 1 is virtually provided with a terminal. FIG. 1 shows an input terminal PGn as a virtual terminal. FIG. 1 shows terminal symbols that are a back gate wiring FNW and a gate wiring PGnF as internal wirings. Further, the semiconductor device 1 is formed in a semiconductor chip, and includes an external connection pad PAD electrically connected to a different device out of the semiconductor chip.

As shown in FIG. 1, the semiconductor device 1 includes a pre-stage circuit 10 and an output-stage circuit 20. In FIG. 1, the pre-stage circuit 10 has a function of transmitting the signals to the output-stage circuit 20 and a voltage-breakdown protecting function of avoiding the output-stage circuit 20 from the voltage-breakdown violation if a higher voltage than the power supply voltage VDD is applied to an external connection pad PAD. The output-stage circuit 20 is a circuit to be a driver for an output signal supplied out of the semiconductor chip. In the example shown in FIG. 1, the output-stage circuit 20 includes an output transistor MP1. The output transistor MP1 is a P-type transistor (such as a PMOS transistor). The power supply voltage VDD is applied to a source of the output transistor MP1, a drain of the same is connected to the external connection pad PAD, and a gate of the same is connected to the gate wiring PGnF. A transistor configuring the pre-stage circuit 10 can be achieved by a transistor that is much smaller than the output transistor MP1.

The pre-stage circuit 10 includes a signal transmitting portion 11 and a voltage-breakdown protecting portion 12. The signal transmitting portion 11 transmits an input signal (such as an input signal to the input terminal PGn) to a gate wiring. The voltage-breakdown protecting portion 12 applies the power supply voltage to a back gate of the output transistor MP1 if the voltage applied on the external connection pad PAD is equal to or lower than the power supply voltage VDD. Alternatively, the voltage-breakdown protecting portion 12 brings the signal transmitting portion 11 into a disconnection state, and applies the voltage applied on the external connection pad PAD to the gate and the back gate of the output transistor MP1 if the voltage applied on the external connection pad PAD is higher than the power supply voltage VDD.

The signal transmitting portion 11 includes a first N-type transistor (such as a NMOS transistor N1), a first P-type transistor (such as a PMOS transistor P1) and a sixth P-type transistor (such as a PMOS transistor P6). The voltage-breakdown protecting portion 12 includes a second P-type transistor (such as a PMOS transistor P2), a third P-type transistor (such as a PMOS transistor P3), a fourth P-type transistor (such as a PMOS transistor P4), and a fifth P-type transistor (such as a PMOS transistor P5). To the input terminal PGn, a gate signal (such as an input signal) having a voltage level of either the ground voltage or the power supply voltage VDD is input. In the transistor, the source and the drain are switched by the voltage applied to the back gate. In the following explanation, a source and a drain in a state in which the voltage of the external connection pad PAD is equal to or lower than the power supply voltage VDD are referred to as the source and the drain of each transistor.

A source of the NMOS transistor N1 is connected to the input terminal PGn, the power supply voltage VDD is applied to a gate of the same, and a drain of the same is connected to the gate wiring PGnF. A back gate of the NMOS transistor N1 is connected to the source of the NMOS transistor N1. A source of the PMOS transistor P1 is connected to the input terminal PGn, a gate of the same is connected to the external connection pad PAD, and a drain of the same is connected to the gate wiring PGnF. A source of the PMOS transistor P6 is connected to the input terminal PGn, a gate and a drain of the same are commonly connected, and the drain of the same is connected to the gate wiring PGnF.

The power supply voltage VDD is applied to a gate of the PMOS transistor P2, a drain of the same is connected to the gate wiring PGnF, and a source of the same is connected to the external connection pad PAD. The power supply voltage VDD is applied to a gate of the PMOS transistor P3, and a source of the same is connected to the external connection pad PAD. The power supply voltage VDD is applied to a source of the PMOS transistor P4, a gate of the same is connected to the external connection pad PAD, and a drain of the same is connected to the drain of the PMOS transistor P3. The power supply voltage VDD is applied to a source of the PMOS transistor P5, a gate and a drain of the same are commonly connected, and the drain of the same is connected to the PMOS transistor P3.

In the semiconductor device 1, the back gates of the PMOS transistors P1 to P6 and the output transistor MP1 are commonly connected to the drains of the PMOS transistors P4 and P5. A layout of the voltage-breakdown protecting portion 12 having such a connection between the drain and the back gate will be explained. Accordingly, FIG. 2 shows a layout diagram of the voltage-breakdown protecting portion of the semiconductor device according to a first embodiment.

Figure 2:
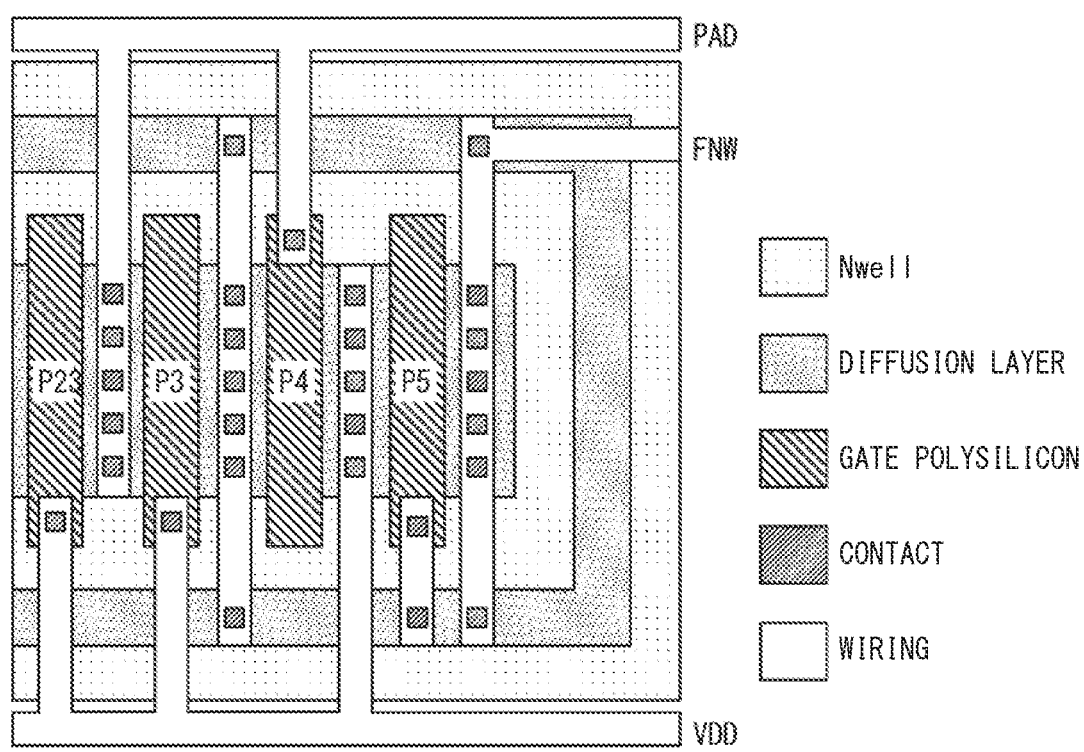
FIG. 2 is a layout diagram of a voltage-breakdown protecting portion of the semiconductor device according to the first embodiment.

As shown in FIG. 2, the voltage-breakdown protecting portion 12 is made of a transistor formed in a region surrounded by a diffusion layer on an N well. By a wiring, the drains of the PMOS transistors P3, P4 and P5 are connected to the diffusion layer surrounding the region where the transistor is formed. The gate of the PMOS transistor P5 is also connected to the diffusion layer surrounding the region where the transistor is formed.

Figure 3:
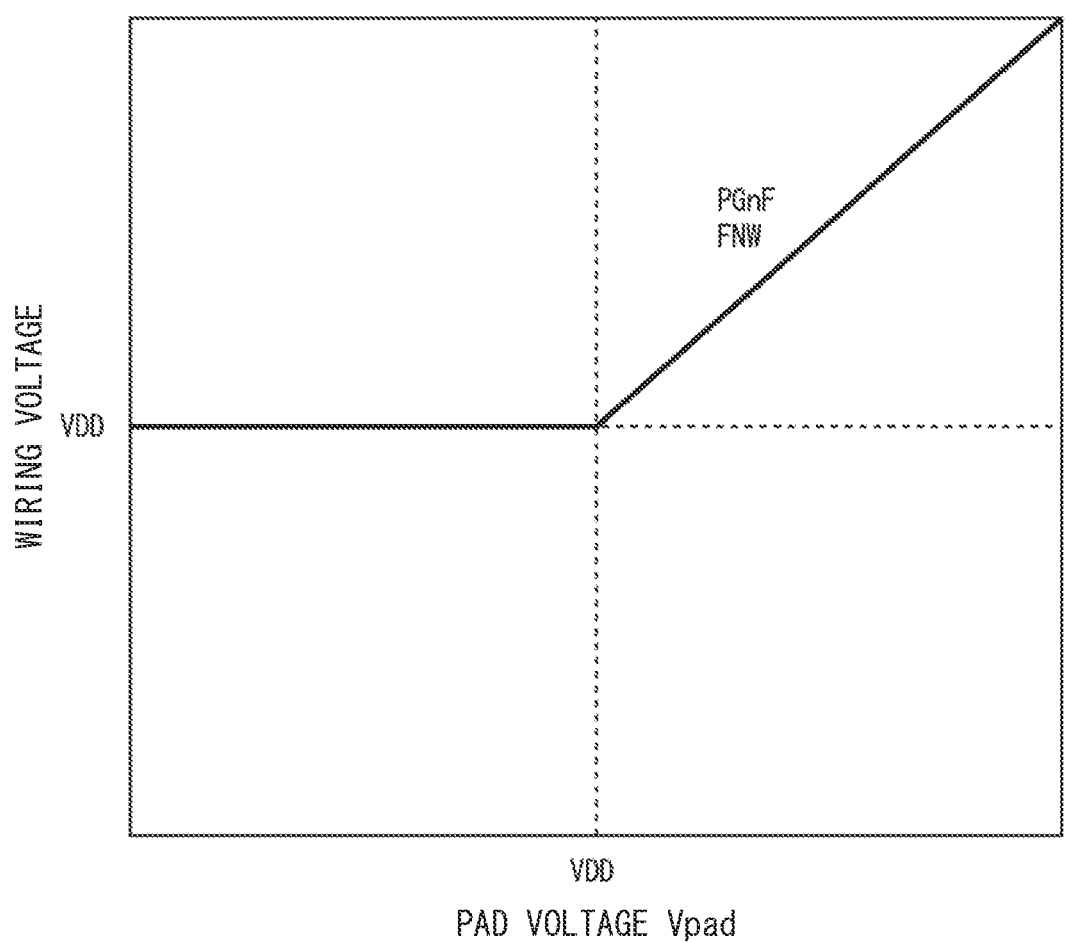
FIG. 3 is an explanatory graph of an operation in the semiconductor device according to the first embodiment.

Next, an operation in the semiconductor device 1 according to the first embodiment will be explained. First, FIG. 3 shows an explanatory graph of the operation in the semiconductor device 1 according to the first embodiment. In the example shown in FIG. 3, in a state in which the input signal to be input to the input terminal PGn is at a high level while the gate wiring PGnF is at a high level, the voltage of the external connection pad PAD is boosted to the voltage that is equal to or higher than the power supply voltage.

As shown in FIG. 3, in the semiconductor device 1 according to the first embodiment, the region where the voltage of the external connection pad PAD is equal to or lower than the power supply voltage is a regular operation region. In this regular operation region, the voltage of each back gate wiring FNW of the output transistor MP1 and the PMOS transistors P1 to P6 is the power supply voltage VDD.

On the other hand, when the higher voltage than the power supply voltage VDD is applied to the external connection pad PAD, the voltage of each of the gate wiring PGnF and the back gate wiring FNW of the semiconductor device 1 is boosted to follow the voltage of the external connection pad PAD. Such a voltage following operation is achieved by the operation of the voltage-breakdown protecting portion 12. Therefore, with reference to the circuit drawings, the operation of the semiconductor device 1 will be explained.

An operation of the regular operation region will be explained with reference to FIGS. 4 to 6, and an operation of an overvoltage application region where a higher voltage than the power supply voltage VDD is applied to the external connection pad PAD will be explained with reference to FIG. 7.

Figure 4:
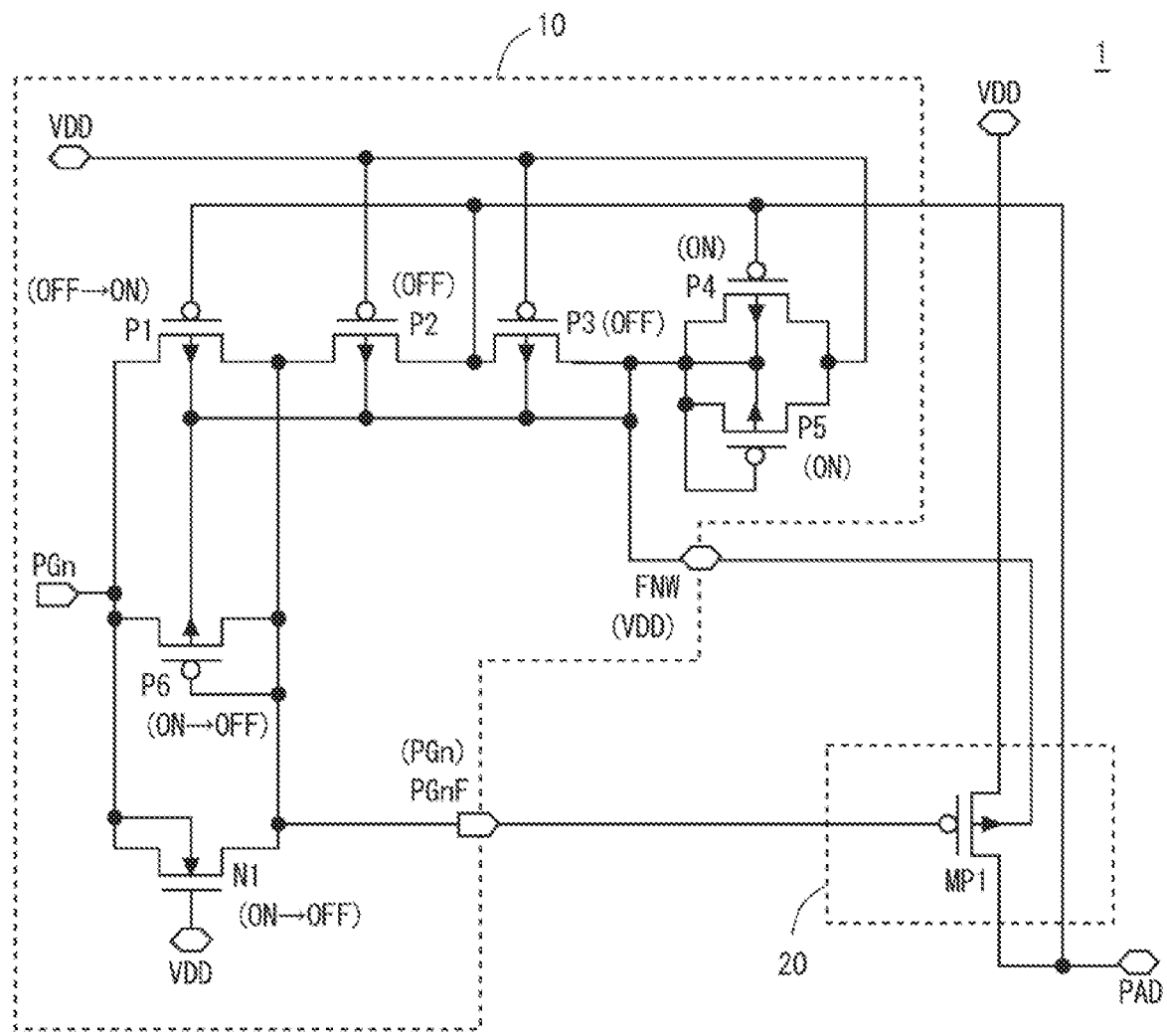
FIG. 4 is an explanatory circuit diagram of an operation in a case of switching a gate signal from a low level to a high level in the semiconductor device according to the first embodiment.

First, FIG. 4 shows an explanatory circuit diagram of an operation in a case of switching the gate signal from the low level to the high level in the semiconductor device according to the first embodiment. FIG. 5 shows an explanatory circuit diagram of an operation in a case of switching the gate signal from the high level to the low level in the semiconductor device according to the first embodiment.

Figure 5:
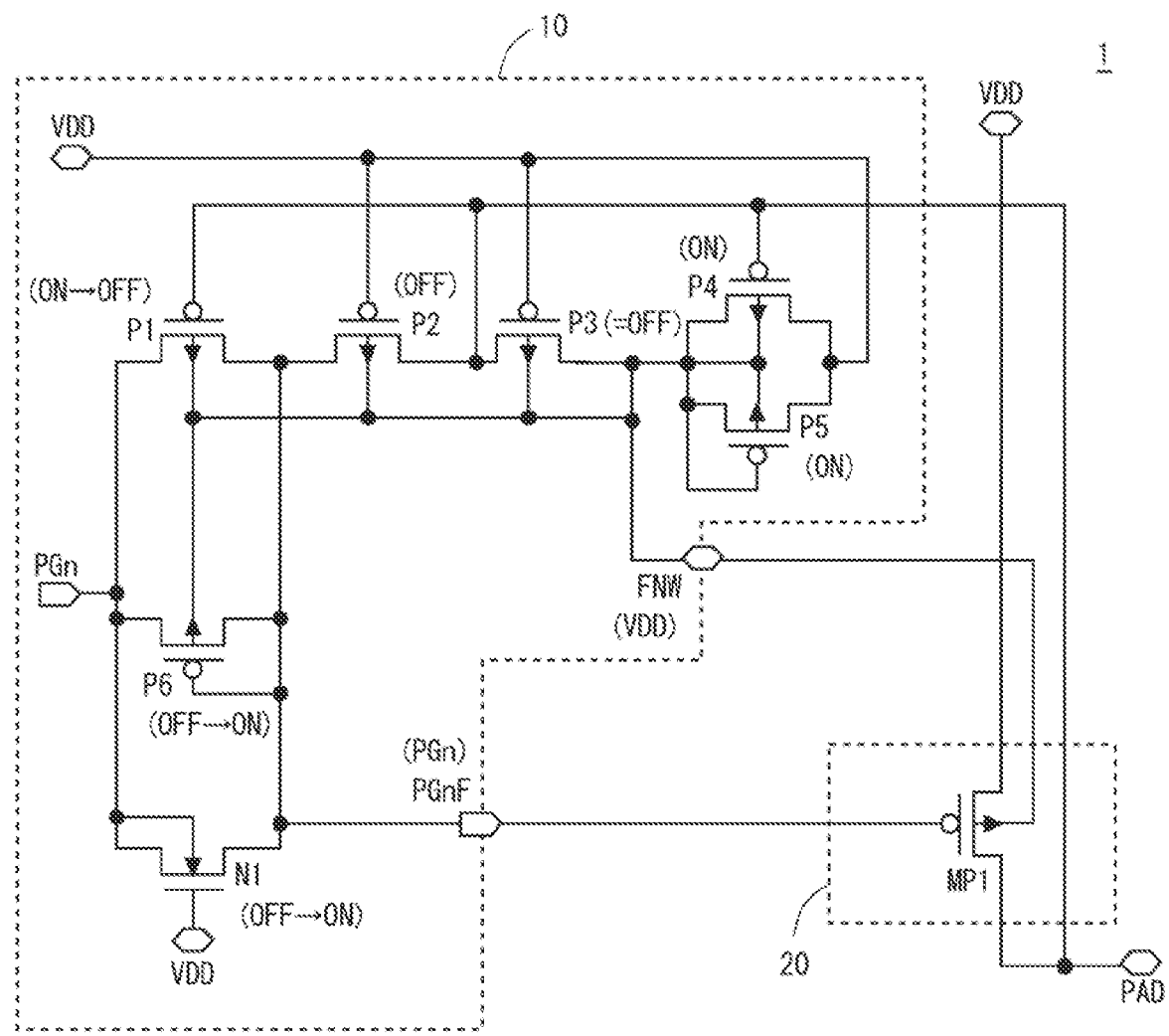
FIG. 5 is an explanatory circuit diagram of an operation in a case of switching the gate signal from the high level to the low level in the semiconductor device according to the first embodiment.

As shown in FIGS. 4 and 5, in the regular operation region of the semiconductor device 1, a voltage Vpad of the external connection pad PAD is applied to the gate of the PMOS transistor P4, and the power supply voltage VDD is applied to the source of the same. The power supply voltage VDD is applied to the source of the PMOS transistor P5, and this transistor functions as a diode. In other words, the PMOS transistor P5 is turned ON. In this manner, the back gate wiring FNW is at the power supply voltage VDD. And, the power supply voltage VDD is applied to the gates of the PMOS transistors P2 and P3 while the voltage Vpad of the external connection pad PAD is applied to the sources of the same, and these transistors are turned OFF.

As shown in FIG. 4, when the input signal changes from the low level to the high level, the NMOS transistor N1 and the PMOS transistor P6 in the semiconductor device 1 are switched from the ON state to the OFF state. The PMOS transistor P1 is switched from the ON state to the OFF state. In this manner, the gate wiring PGnF is switched from the low level to the high level, and the output transistor MP1 is switched from the ON state to the OFF state. The external connection pad PAD is switched from the high level to the low level.

As shown in FIG. 5, when the input signal changes from the high level to the low level, the NMOS transistor N1 and the PMOS transistor P6 in the semiconductor device 1 are switched from the OFF state to the ON state. The PMOS transistor P1 is switched from the ON state to the OFF state. In this manner, the gate wiring PGnF is switched from the high level to the low level, and the output transistor MP1 is switched from the OFF state to the ON state. The external connection pad PAD is switched from the low level to the high level.

When the NMOS transistor N1 changes from the OFF state to the ON state, the extraction of charges from the gate wiring PGnF is delayed until an ON resistance of the NMOS transistor N1 becomes low. In this case, the PMOS transistor P6 becomes in the low resistance state at an earlier timing than the NMOS transistor N1 since the gate of the PMOS transistor P6 is connected to the gate wiring PGnF, and therefore, the voltage drop of the gate wiring PGnF is accelerated. In other words, by the arrangement of the PMOS transistor P6, the voltage drop operation of the gate wiring PGnF can be rapidly performed.

Next, an operation of the semiconductor device 1 at the time of power-ON in a state in which the external connection pad PAD is open and has an unfixed voltage state will be explained.

Figure 6:
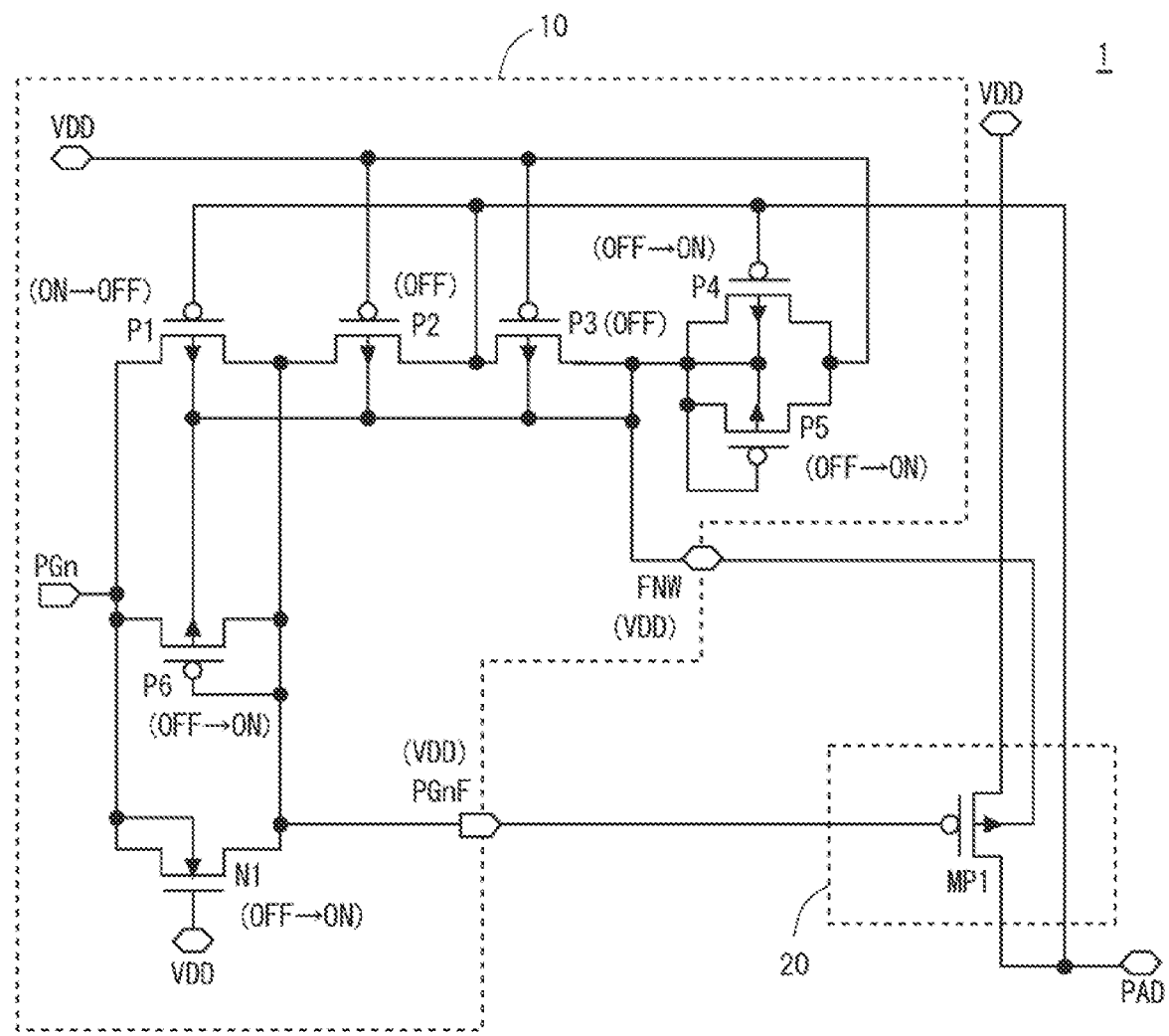
FIG. 6 is an explanatory circuit diagram of an operation at power ON of the semiconductor device according to the first embodiment.

As shown in FIG. 6, when the power supply voltage changes from 0 V to the power supply voltage VDD, the voltage of the gate of the PMOS transistor P4 is unfixed since the voltage of the external connection pad PAD is unfixed. Therefore, a leakage electric current flows in the PMOS transistor P4. In this manner, the voltage of the drain of the PMOS transistor P4 changes to the power supply voltage VDD. The voltage of the gate of the PMOS transistor P5 is also unfixed at the time of the power ON. In this case, since the voltage of the source of the PMOS transistor P5 becomes the power supply voltage VDD, a leakage electric current flows in the PMOS transistor P5. In this manner, the voltage of the drain of the PMOS transistor also changes to the power supply voltage VDD.

In this manner, by the arrangement of the PMOS transistor P5, a leakage electric current in a case of an unfixed voltage Vpad of the external connection pad PAD is made more than that of the arrangement of only the PMOS transistor P4. Therefore, the voltage of the back gate wiring FNW can be made earlier to be fixed to the power supply voltage VDD.

Next, an operation of the semiconductor device 1 in the overvoltage application region where the voltage Vpad of the external connection pad PAD is equal to or higher than the power supply voltage VDD will be explained. Therefore, FIG. 7 shows an explanatory circuit diagram of an operation in a case of the higher voltage of the external connection pad PAD than the power supply voltage in the semiconductor device according to the first embodiment.

Figure 7:
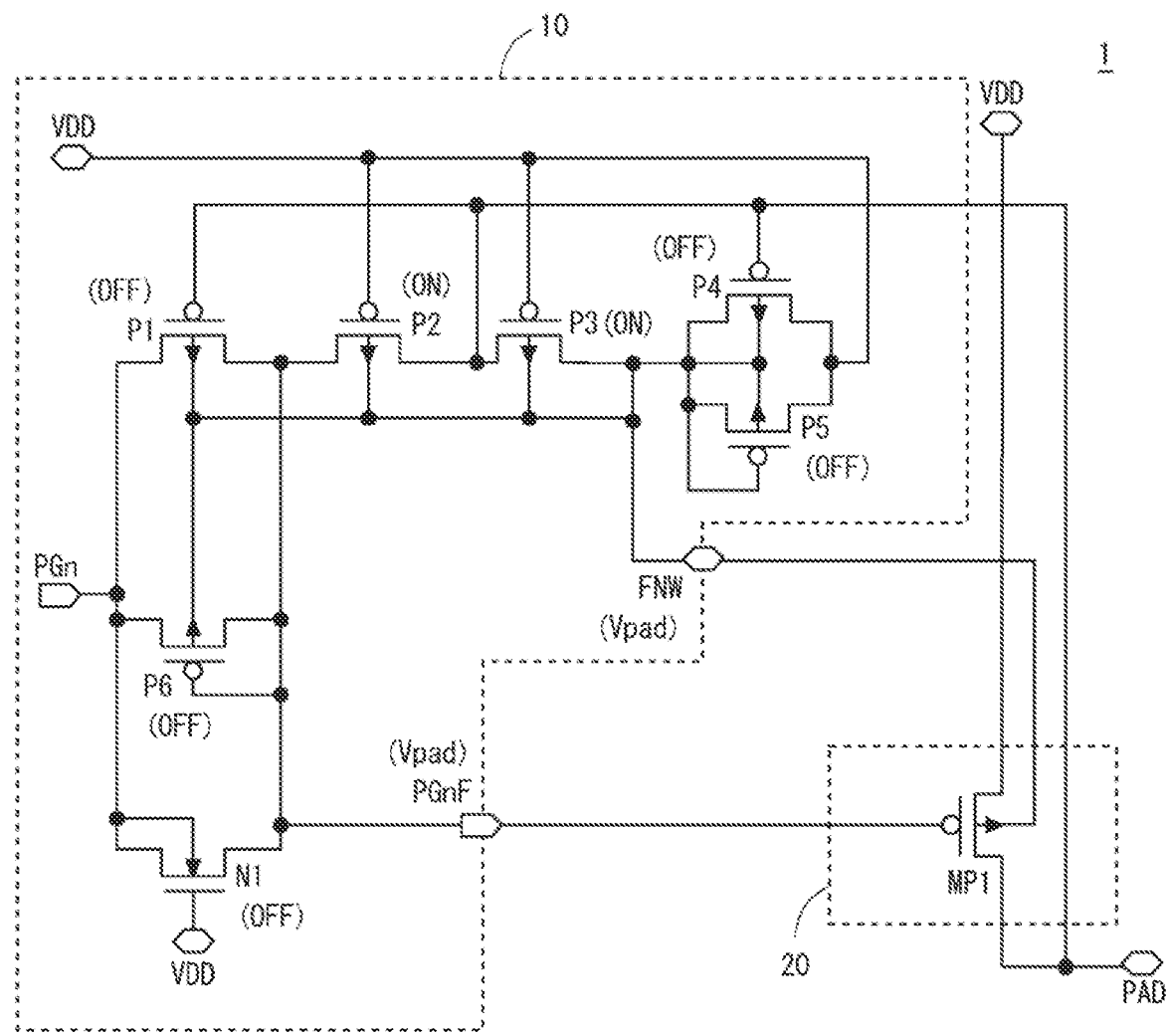
FIG. 7 is an explanatory circuit diagram of an operation in a case of a higher voltage of an explanatory connection pad than a power supply voltage in the semiconductor device according to the first embodiment.

As shown in FIG. 7, in the case of the higher voltage Vpad of the external connection pad PAD than the power supply voltage VDD, the PMOS transistor P4 to which the voltage Vpad is applied is turned OFF since its gate voltage is higher than the power supply voltage VDD. On the other hand, the PMOS transistors P3 and P2 are turned ON since the voltage Vpad is applied to their sources while the power supply voltage VDD is applied to their gates. In this manner, the voltages of the back gate wiring FNW and the gate wiring PGnF become the voltage Vpad of the external connection pad PAD.

The PMOS transistors P1 and P6 are turned OFF since there is no potential difference between the source (or the drain in the regular operation region) and the gate. The NMOS transistor N1 is also turned OFF. In other words, the signal transmitting portion 11 disconnects the input signal from the input terminal PGn.

In this case, as shown in FIG. 7, the overvoltage application region, each back gate voltage of the PMOS transistors P1 to P6 and the output transistor MP1 becomes the voltage Vpad of the external connection pad PAD, and each gate voltage of the PMOS transistors P1, P4, P5 and P6 and the output transistor MP1 also becomes the voltage Vpad. Each gate voltage of the PMOS transistors P2 and P3 becomes the power supply voltage VDD. Therefore, in the semiconductor device 1, even if the voltage Vpad is twice the power supply voltage VDD, the voltage difference between the gate and the back gate of the PMOS transistors P1 to P6 and the output transistor MP1 is only about the power supply voltage VDD, and therefore, the voltage breakdown specification of the transistor can be satisfied.

The above-described explanation shows that, if the voltage of the external connection pad is higher than the power supply voltage in the semiconductor device 1 according to the first embodiment, the voltage-breakdown protecting portion 12 brings the signal transmitting portion 11 into the disconnection state, and applies the voltage of the external connection pad to the back gate and the gate of the output transistor MP1. In this manner, in the semiconductor device 1 according to the first embodiment, even if the number of stages of the output transistor MP1 of the output-stage circuit 20 is one, the voltage breakdown specification of the transistor can be also satisfied in the case of the voltage Vpad that is about twice the power supply voltage VDD. In other words, in the semiconductor device 1 according to the first embodiment, the breakdown voltage of the external connection pad PAD can be made higher than the voltage value of the breakdown voltage specification of the output transistor MP1.

The signal transmitting portion 11 and the voltage-breakdown protecting portion 12 are made of the seven transistors. However, these transistors are not used as the output-stage circuit, and therefore, do not need to have a low resistance as low as that of the output transistor MP1. Therefore, each transistor configuring the signal transmitting portion 11 and the voltage-breakdown protecting portion 12 can be achieved by a much smaller transistor than the output transistor MP1. Therefore, the chip size of the semiconductor device 1 according to the first embodiment can be made small. The larger the difference in the transistor size between the output transistor MP1 and each transistor configuring the signal transmitting portion 11 and the voltage-breakdown protecting portion 12 is, the larger the effect of the size reduction of the chip size is.

Since the output-stage circuit 20 in the semiconductor device 1 according to the first embodiment can be made of a single-stage transistor, a terminal capacitance of the external connection pad PAD can be lowered. Because of the lowering of the terminal capacitance as described above, a signal having a higher frequency can be handled.

Second Embodiment

In a second embodiment, a semiconductor device 2 according to a different embodiment from the semiconductor device 1 will be explained. In the explanation of the second embodiment, the same components as the components explained in the first embodiment will be denoted with the same reference symbols as those of the first embodiment, and the explanation for the components will be omitted.

Figure 8:
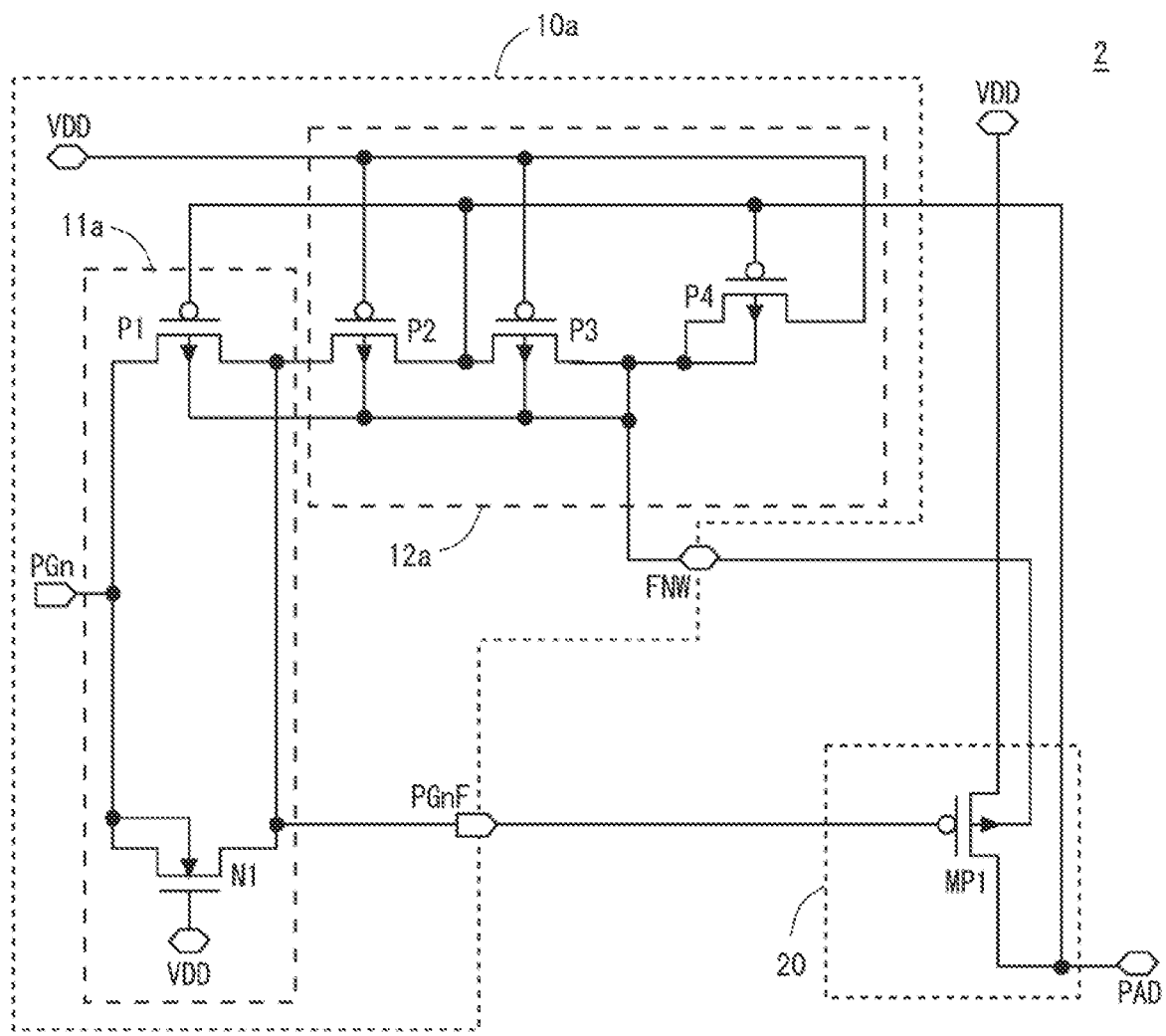
FIG. 8 is a circuit diagram of a semiconductor device according to a second embodiment.

FIG. 8 shows a circuit diagram of the semiconductor device 2 according to the second embodiment. As shown in FIG. 8, the semiconductor device 2 according to the second embodiment includes a pre-stage circuit 10a including a signal transmitting portion 11a and a voltage-breakdown protecting portion 12a in place of the signal transmitting portion 11 and the voltage-breakdown protecting portion 12. The signal transmitting portion 11a is made by removal of the PMOS transistor P6 from the signal transmitting portion 11. The voltage-breakdown protecting portion 12a is made by removal of the PMOS transistor P5 from the voltage-breakdown protecting portion 12.

The PMOS transistor P6 accelerates the potential drop of the gate wiring PGnF. However, the PMOS transistor PG may be removed if the specification of the semiconductor device 2 allows the semiconductor device to be operated at a low operational speed. And, when the voltage Vpad of the external connection pad PAD is unfixed at the me of the power ON, the PMOS transistor P5 assists the fixation of the voltage of the back gate wiring FNW. However, the PMOS transistor P5 may not be used if the potential of the external connection pad PAD is fixed to the ground voltage or others at the time of the power ON. For example, the PMOS transistor P5 can be removed if the voltage of the external connection pad PAD is configured to be pulled down in the outside.

The above-described explanation shows that the semiconductor device 2 according to the second embodiment can have the less number of transistors than that of the semiconductor device 1 and the smaller chip size than that of the first embodiment.

Third Embodiment

In a third embodiment, a semiconductor device 3 according to a different embodiment from that of the semiconductor device 1 will be explained. In the explanation of the third embodiment, the same components as the components explained in the first embodiment will be denoted with the same reference symbols as those of the first embodiment, and the explanation for the components will be omitted.

Figure 9:
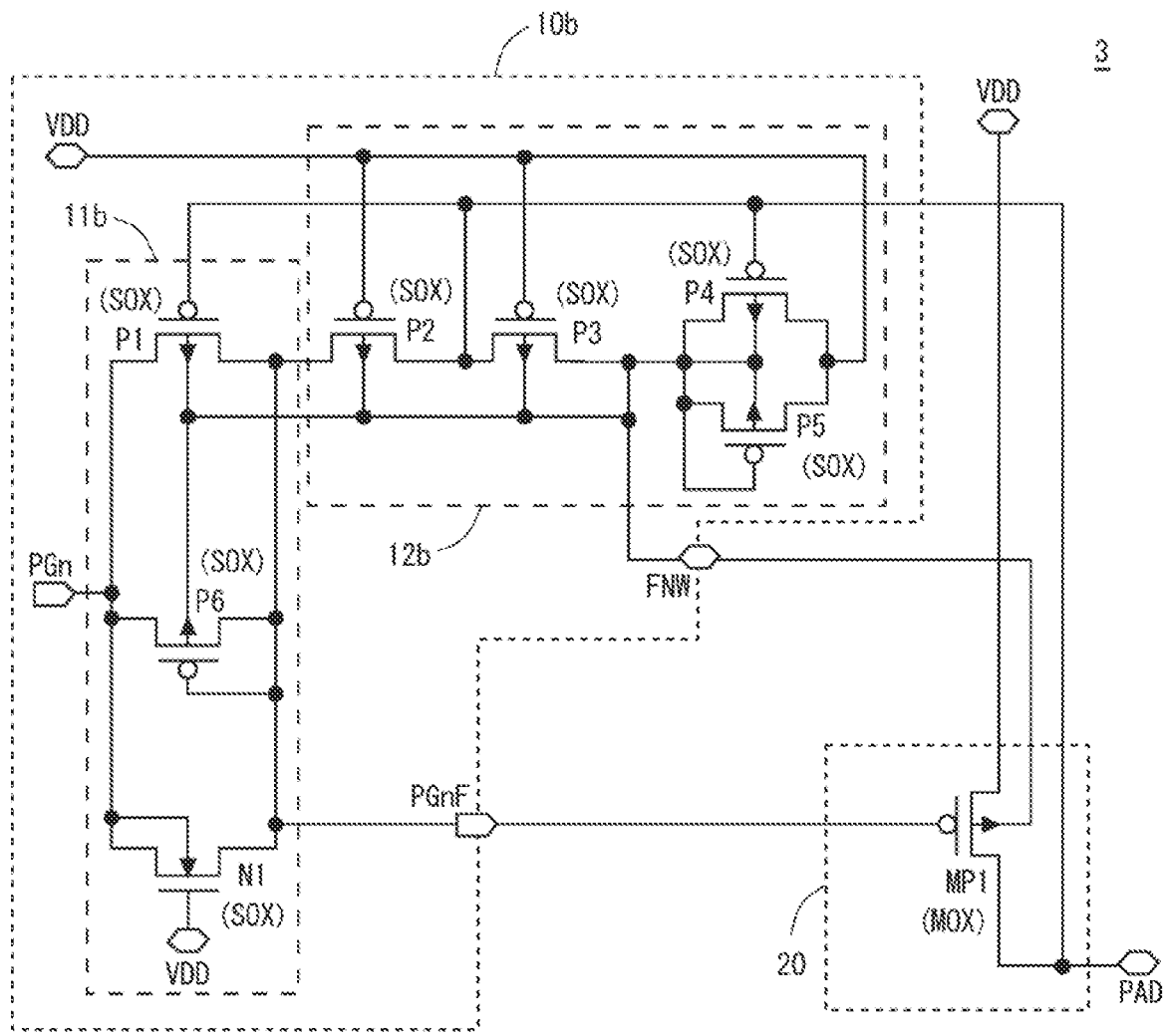
FIG. 9 is a circuit diagram of a semiconductor device according to a third embodiment.

FIG. 9 shows a circuit diagram of the semiconductor device according to the third embodiment. As shown in FIG. 9, in the semiconductor device 3 according to the third embodiment, each of the NMOS transistor N1 and the PMOS transistors P1 to P6 is made of a thin film transistor having a thinner gate oxidation film than that of the output transistor MP1. In FIG. 9, the signal transmitting portion 11 and the voltage-breakdown protecting portion 12 made of the thin film transistor are illustrated as a signal transmitting portion 11b and a voltage-breakdown protecting portion 12b.

Since the thin film transistor is used as described above, each area of the NMOS transistor N1 and the PMOS transistors P1 to P6 on the chip can be further reduced.

Fourth Embodiment

In a fourth embodiment, a semiconductor device 4 according to a different embodiment from that of the semiconductor device 1 will be explained. In the explanation of the fourth embodiment, the same components as the components explained in the first embodiment will be denoted with the same reference symbols as those of the first embodiment, and the explanation for the components will be omitted.

Figure 10:
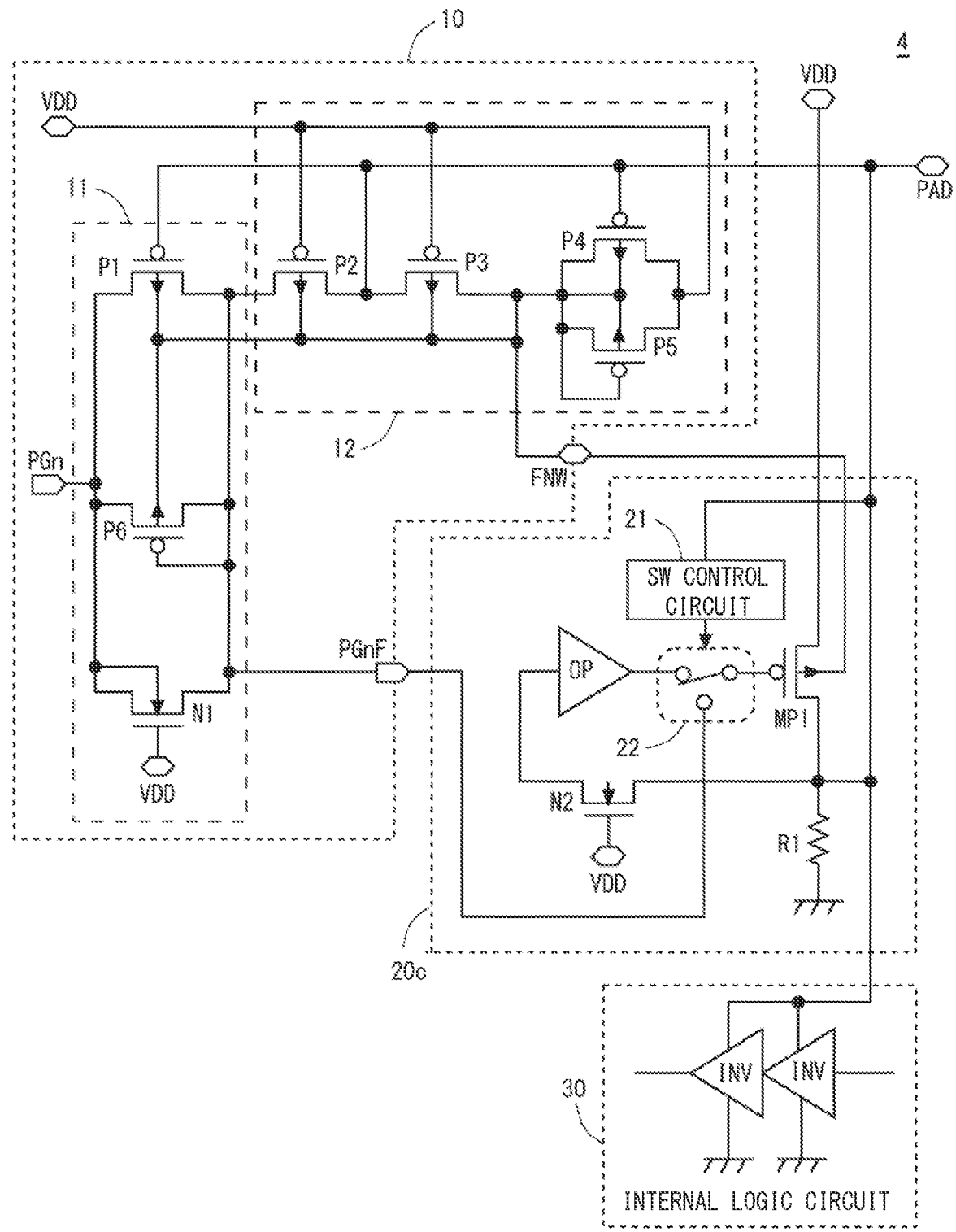
FIG. 10 is a circuit diagram of a semiconductor device according to a fourth embodiment.

FIG. 10 shows a circuit diagram of the semiconductor device 4 according to the fourth embodiment. As shown in FIG. 10, the semiconductor device 4 according to the fourth embodiment includes an output-stage circuit 20c in place of the output-stage circuit 20. The output-stage circuit 20c is a regulator circuit using the output transistor MP1 as a driving transistor. And, the semiconductor device 4 according to the fourth embodiment includes an internal logic circuit 30 to supply a power to the internal logic circuit 30 from either the output-stage circuit 20c or the external power supply through the external connection pad PAD.

The output-stage circuit 20c includes a load resistor R1, a second N-type transistor (such as NMOS transistor N2), an operational amplifier OP, a switch control circuit 21 and a switch 22 in addition to the output transistor MP1. One end of the load resistor R1 is connected to the drain of the output transistor MP1, and the ground potential is applied to the other end. The NMOS transistor N2 is connected between an input terminal of the operational amplifier OP and one end of the load resistor R1, and the power supply voltage VDD is applied to a gate of the NMOS transistor. The switch 22 switches the gate of the output transistor MP1 to be connected to either an output terminal of the operational amplifier OP or the gate wiring. The switch control circuit 21 instructs the switch 22 to connect the gate of the output transistor MP1 to the gate wiring PGnF if the voltage Vpad of the external connection pad PAD is higher than the power supply voltage VDD. Alternatively, the switch control circuit 21 instructs the switch 22 to connect the gate of the output transistor MP1 to the output terminal of the operational amplifier OP if the voltage Vpad of the external connection pad PAD is equal to or lower than the power supply voltage VDD.

In the semiconductor device 4 according to the fourth embodiment, if the voltage Vpad of the external connection pad PAD is higher than the power supply voltage VDD, the voltage-breakdown violation of the output transistor MP1 is avoided by the same operation as that of the semiconductor device 1 according to the first embodiment. In this case, the NMOS transistor N2 prevents the overvoltage from being applied to the input terminal of the operational amplifier OP. Meanwhile, in the semiconductor device 4, in the general operational region where the voltage Vpad of the external connection pad PAD is equal to or lower than the power supply voltage VDD, the output transistor MP1 is used as the driving transistor of the regulator.

In the semiconductor device 4 according to the fourth embodiment, the driving transistor of the regulator circuit configured as the output-stage circuit 20c can be configured to be a single-stage driving transistor, and therefore, the semiconductor device 4 can more suppress the variation in the driving performance of the regulator circuit than a case of a multiple-stage driving transistor.

Fifth Embodiment

In a fifth embodiment, a semiconductor device 5 according to a different embodiment from that of the semiconductor device 4 will be explained. In the explanation of the fifth embodiment, the same components as the components explained in the first and fourth embodiments will be denoted with the same reference symbols as those of the first and fourth embodiments, and the explanation for the components will be omitted.

Figure 11:
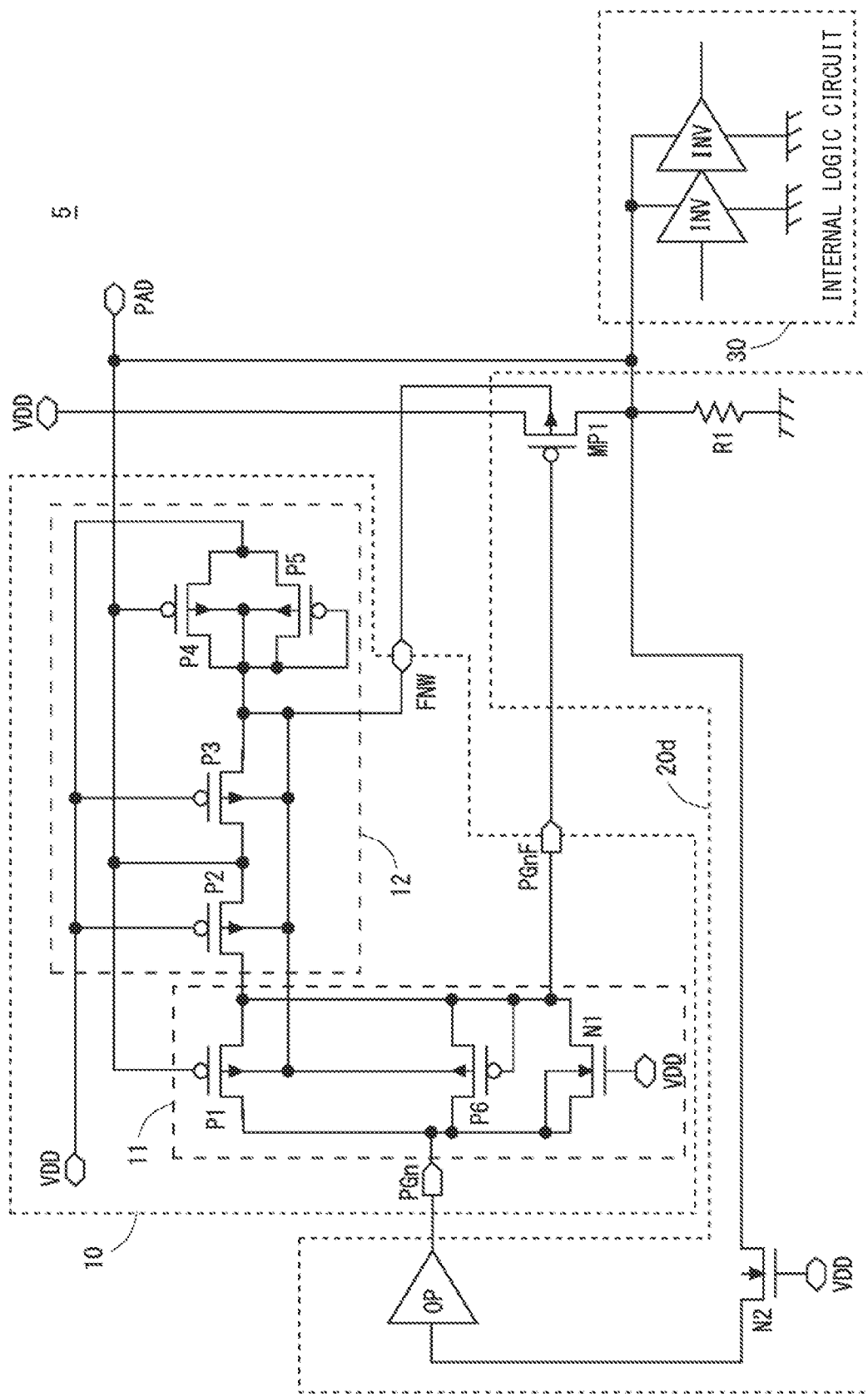
FIG. 11 is a circuit diagram of a semiconductor device according to a fifth embodiment.

FIG. 11 shows a circuit diagram of the semiconductor device 5 according to the fifth embodiment. As shown in FIG. 5, in the semiconductor device 5 according to the fifth embodiment, an output-stage circuit 20d is used in place of the output-stage circuit 20c of the semiconductor device 4.

The output-stage circuit 20d includes a load resistor R1, an NMOS transistor N2 and an operational amplifier OP in addition to the output transistor MP1. An output end of the operational amplifier OP is connected to the input terminal PGn. One end of the load resistor R1 is connected to the drain of the output transistor MP1, and the ground potential is applied to the other end. The NMOS transistor N2 is connected between an input terminal of the operational amplifier OP and one end of the load resistor R1, and the power supply voltage VDD is applied to a gate of the NMOS transistor. In other words, the output-stage circuit 20d is a regulator circuit supplying the power to the internal logic circuit 30 as similar to the output-stage circuit 20c. In the out-stage circuit 20d in this case, the pre-stage circuit 10 is configured to be sandwiched between the output terminal of the operational amplifier OP and the gate of the output transistor MP1.

In this manner, in the fifth embodiment, the switch control circuit 21 and the switch 22 used in the semiconductor device 4 can be removed. By the simplified circuit as described above, the chip size of the semiconductor device 5 can be made smaller than that of the semiconductor device 4.

In the foregoing, the invention made by the present inventors has been concretely described on the basis of the embodiments. However, it is needless to say that the present invention is not limited to the foregoing embodiments, and various modifications can be made within the scope of the present invention.

What is claimed is:

1. A semiconductor device comprising:
  a P-type output transistor configured to have a source to which a power supply voltage is applied, a drain connected to an external connection pad, and a gate connected to a gate wiring;
  a first N-type transistor configured to have a source connected to an input terminal to which a gate signal having a voltage level of either a ground voltage or the power supply voltage is input, a gate to which the power supply voltage is applied, and a drain connected to the gate wiring;
  a first P-type transistor configured to have a source connected to the input terminal, a gate connected to the external connection pad, and a drain connected to the gate wiring;
  a second P-type transistor configured to have a gate to which the power supply voltage is applied, a drain connected to the gate wiring, and a source connected to the external connection pad;
  a third P-type transistor configured to have a gate to which the power supply voltage is applied, and a source connected to the external connection pad;
  a fourth P-type transistor configured to have a source to which the power supply voltage is applied, a gate connected to the external connection pad, and a drain connected to the drain of the third P-type transistor; and
  a fifth P-type transistor configured to have a source connected to the input terminal, a gate and a drain commonly connected, and the drain connected to the gate wiring,
  wherein back gates of the output transistor, the first P-type transistor, the second P-type transistor, the third P-type transistor and the fourth P-type transistor is connected to the drain of the fourth P-type transistor,
  wherein when a voltage applied on the external connection pad is equal to or lower than the power supply voltage, the fourth P-type transistor is turned on and applies the power supply voltage to the back gates of the output transistor, the first P-type transistor, the second P-type transistor, the third P-type transistor and the fourth P-type transistor via the source and drain of the fourth P-type transistor, and
  wherein when the voltage applied on the external connection pad is higher than the power supply voltage, the fourth P-type transistor is turned off, the second P-type transistor is turned on to apply the voltage on the external connection pad to the gate of the output transistor, and the third P-type transistor is turned on to apply the voltage on the external connection pad to the back gate of the output transistor.

2. The semiconductor device according to claim 1 further comprising
  a sixth P-type transistor configured to have a source to which the power supply voltage is applied, a gate and a drain commonly connected, and the drain connected to the drain of the third P-type transistor.

3. The semiconductor device according to claim 1,
  wherein each gate oxidation film of the first N-type transistor, the first P-type transistor, the second P-type transistor, the third P-type transistor and the fourth P-type transistor is thinner than that of the output transistor.

4. The semiconductor device according to claim 1 further comprising
  an operational amplifier;
  a load resistor configured to have one end connected to the drain of the output transistor and the other end to which the ground voltage is applied;
  a second N-type transistor configured to be connected between an input terminal of the operational amplifier and one end of the load resistor, and configured to have a gate to which the power supply voltage is applied;
  a switch configured to switch the gate of the output transistor to be connected to either an output terminal of the operational amplifier or the gate wiring; and a switch control circuit configured to instruct the switch to connect the gate of the output transistor to the gate wiring when a voltage of the external connection pad is higher than the power supply voltage, or instruct the switch to connect the gate of the output transistor to the output terminal of the operational amplifier when the voltage of the external connection pad is equal to or lower than the power supply voltage.

5. The semiconductor device according to claim 1 further comprising:
an operational amplifier configured to have an output end connected to the input terminal;
a load resistor configured to have one end connected to the drain of the output transistor, and the other end to which the ground voltage is applied; and
a second N-type transistor configured to be connected between an input terminal of the operational amplifier and one end of the load resistor, and configured to have a gate to which the power supply voltage is applied.

6. A semiconductor device comprising:
a P-type output transistor configured to have a source to which a power supply voltage is applied, and a drain connected to an external connection pad;
a gate wiring configured to be connected to a gate of the output transistor;
a signal transmitting portion configured to transmit an input signal to the gate wiring; and
a voltage-breakdown protecting portion;
a first N-type transistor included in the signal transmitting portion and configured to have a source connected to an input terminal to which a gate signal having a voltage level of either a ground voltage or the power supply voltage is input, a gate to which the power supply voltage is applied, and a drain connected to the gate wiring;
a first P-type transistor included in the signal transmitting portion and configured to have a source connected to the input terminal, a gate connected to the external connection pad, and a drain connected to the gate wiring;
a second P-type transistor included in the voltage-breakdown protecting portion and configured to have a gate to which the power supply voltage is applied, a drain connected to the gate wiring, and a source connected to the external connection pad;
a third P-type transistor included in the voltage-breakdown protecting portion and configured to have a gate to which the power supply voltage is applied, and a source connected to the external connection pad;
a fourth P-type transistor included in the voltage-breakdown protecting portion and configured to have a source to which the power supply voltage is applied, a gate connected to the external connection pad, and a drain connected to the drain of the third P-type transistor; and
a fifth P-type transistor included in the signal transmitting portion and configured to have a source connected to the input terminal, a gate and a drain commonly connected, and the drain connected to the gate wiring,
wherein the voltage-breakdown protecting portion applies the power supply voltage to a back gate of the output transistor when a voltage applied on the external connection pad is equal to or lower than the power supply voltage, and
wherein the voltage-breakdown protecting portion brings the signal transmitting portion into a disconnection state and applies the voltage on the external connection pad to the gate and the back gate of the output transistor when the voltage applied on the external connection pad is higher than the power supply voltage.

* * * * *